(12) United States Patent
Yang et al.

(10) Patent No.: US 7,974,066 B2
(45) Date of Patent: Jul. 5, 2011

(54) WIRELESS COMMUNICATION DEVICE

(75) Inventors: Shih-Chian Yang, Taipei Hsien (TW); Ting-Kong Hsieh, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 166 days.

(21) Appl. No.: 12/512,213

(22) Filed: Jul. 30, 2009

(65) Prior Publication Data

US 2010/0110601 A1     May 6, 2010

(30) Foreign Application Priority Data

Nov. 6, 2008  (CN) .......................... 2008 1 0305413

(51) Int. Cl.
*H05F 3/00*      (2006.01)
(52) U.S. Cl. ........................................ 361/220; 361/212
(58) Field of Classification Search .................... 361/56, 361/212, 220
See application file for complete search history.

(56) References Cited

U.S. PATENT DOCUMENTS 7,567,419 B2 *   7/2009  Lu et al. ........................ 361/220
7,629,928 B2 *  12/2009  Fabrega-Sanchez et al. ........................ 343/700 MS

* cited by examiner

*Primary Examiner* — Danny Nguyen
(74) *Attorney, Agent, or Firm* — Raymond J. Chew

(57) ABSTRACT

A wireless communication device includes a PCB, a grounded electrostatic protection element and an antenna. The PCB includes a ground and an antenna clearance portion. The ground portion includes a ground layer. The antenna clearance portion overlaps the antenna and includes a plurality of second key contacts, a plurality of ground contacts and a plurality of microstrips. The second key contacts are placed on a top surface of the PCB. The ground contacts and the microstrips are placed on a bottom surface of the PCB and corresponding to the second key contacts. The plurality of microstrips connect the plurality of ground contacts to the ground layer. The electrostatic protection element connects the second key contacts to protect them from electrostatic interference.

4 Claims, 7 Drawing Sheets

WIRELESS COMMUNICATION DEVICE

BACKGROUND

1. Technical Field

The present disclosure relates to wireless communication devices, and, specifically, to a wireless communication device having a printed circuit board (PCB), on which a plurality of key contacts are laid out, the PCB overlapping with an antenna of the wireless communication device.

2. Description of Related Art

Referring to FIG. 5-FIG. 7, a mobile phone having an inner antenna 300 includes a display screen portion and a key portion positioned below the display screen portion. The antenna 300 is located near the bottom of the mobile phone, and a PCB 100 overlaps the antenna 300. A plurality of key contacts 180 surrounded by an electrostatic ring 200 are disposed on the PCB 100. The PCB 100 includes a ground layer 120. The electrostatic ring 200 can protect the key contacts 180 from electrostatic interference. However, when the antenna 300 is in use, the ground layer 120 of the PCB 100 can absorb signals from the antenna 300, weakening the signal transceiving capabilities of the antenna 300.

Therefore, a need exists in the industry to overcome the described limitations.

DETAILED DESCRIPTION

Figure 1:
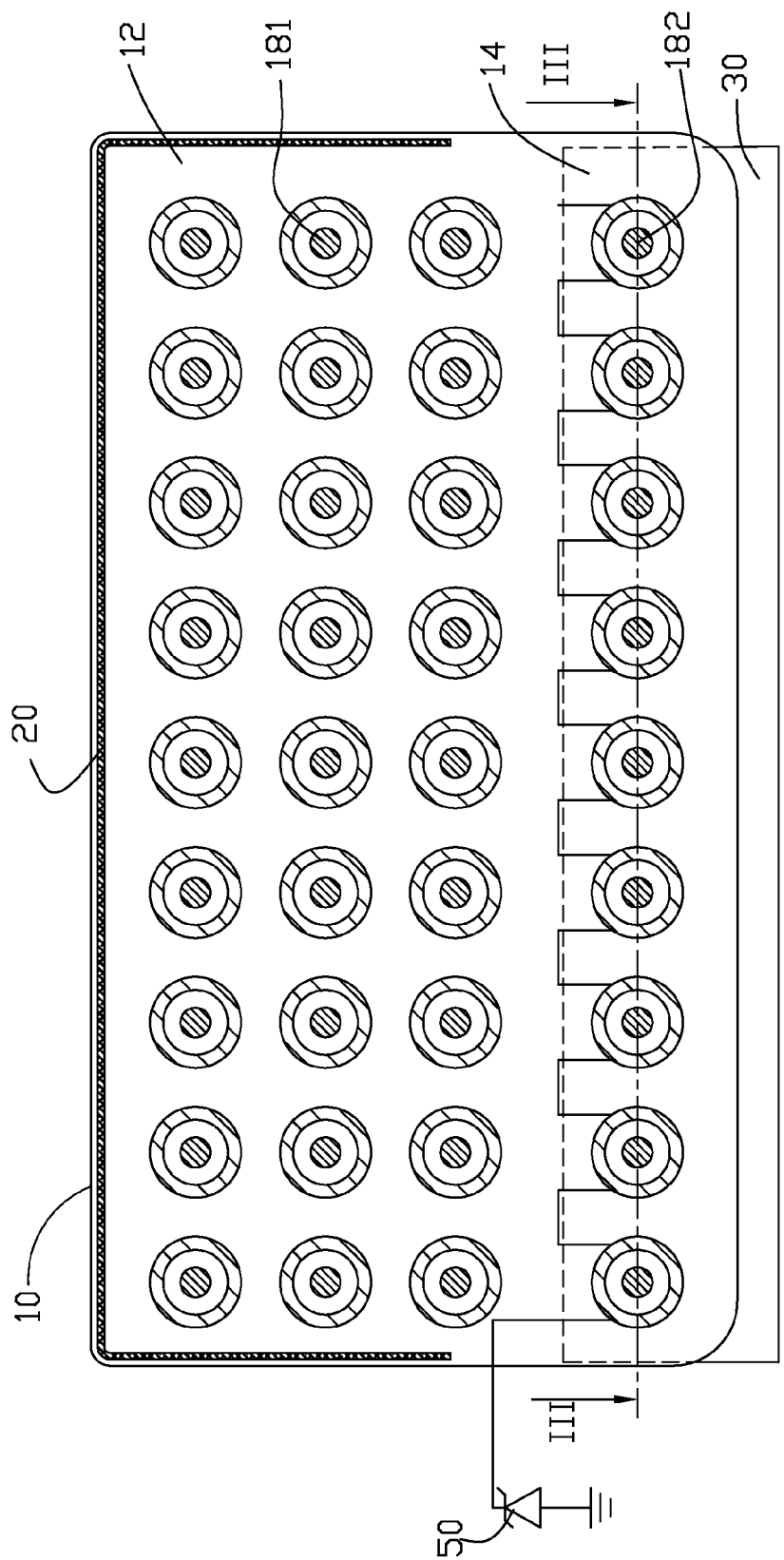
FIG. 1 is a top schematic view of a PCB layout of a wireless communication device in accordance with the disclosure.
Figure 2:
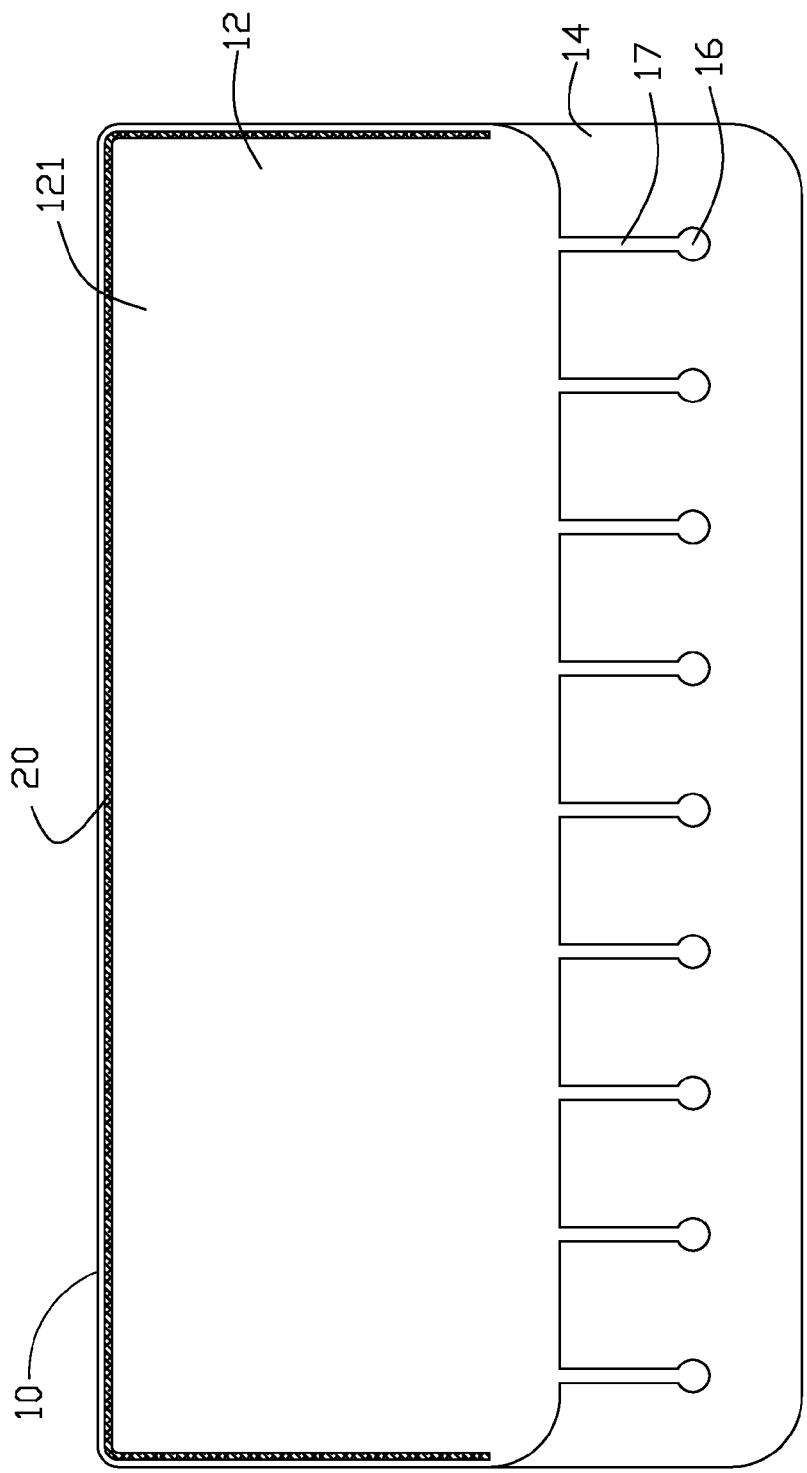
FIG. 2 is a bottom schematic view of the PCB layout of FIG. 1.

Referring to FIG. 1 and FIG. 2, a wireless communication device includes an antenna 30 and a printed circuit board (PCB) 10. The antenna 30 is disposed on a mainboard (not shown) of the wireless communication device, and the antenna 30 overlaps the PCB 10. The PCB 10 includes a ground portion 12 and an antenna clearance portion 14. In this embodiment, the ground portion 12 abuts on the antenna clearance portion 14. The antenna clearance portion 14 overlaps the antenna 30.

The ground portion 12 is configured with a plurality of first key contacts 181 surrounded by an electrostatic ring 20 and a ground layer 121. The plurality of first key contacts 181 are disposed on a portion of a top surface of the PCB 10 and arranged in rows and columns in the area of the ground portion 12, and the ground layer 121 is disposed on a portion of a bottom surface of the PCB 10 corresponding to the portion of the top surface. The electrostatic ring 20 can conduct static electricity to the ground layer 121 to protect the first key contacts 181 from electrostatic interference.

The antenna clearance portion 14 is configured with a plurality of second key contacts 182, a plurality of ground contacts 16, and a plurality of microstrips 17. The plurality of second key contacts 182 are disposed on another portion of the top surface of the PCB 10 and arranged in rows in the area of the antenna clearance portion 14. The plurality of ground contacts 16 and the plurality of microstrips 17 are disposed on another portion of the bottom surface of the PCB 10 corresponding to the another portion of the top surface. The plurality of microstrips 17 electrically connect the plurality of ground contacts 16 to the ground layer 121 of the ground portion 12. In this embodiment, the plurality of ground contacts 16 are substantially circular shaped, and each ground contact 16 is disposed on a middle portion of a projection of a corresponding second key contact 182 on the bottom surface of the PCB 10.

A grounded electrostatic protection element 50, such as a diode, is electrically connected to the plurality of second key contacts 182 to protect the second key contacts 182 from electrostatic interference. The electrostatic protection element 50 can be disposed on the PCB 10 or on the main board of the wireless communication device. Alternatively, two or more electrostatic protection elements can be utilized.

Figure 3:
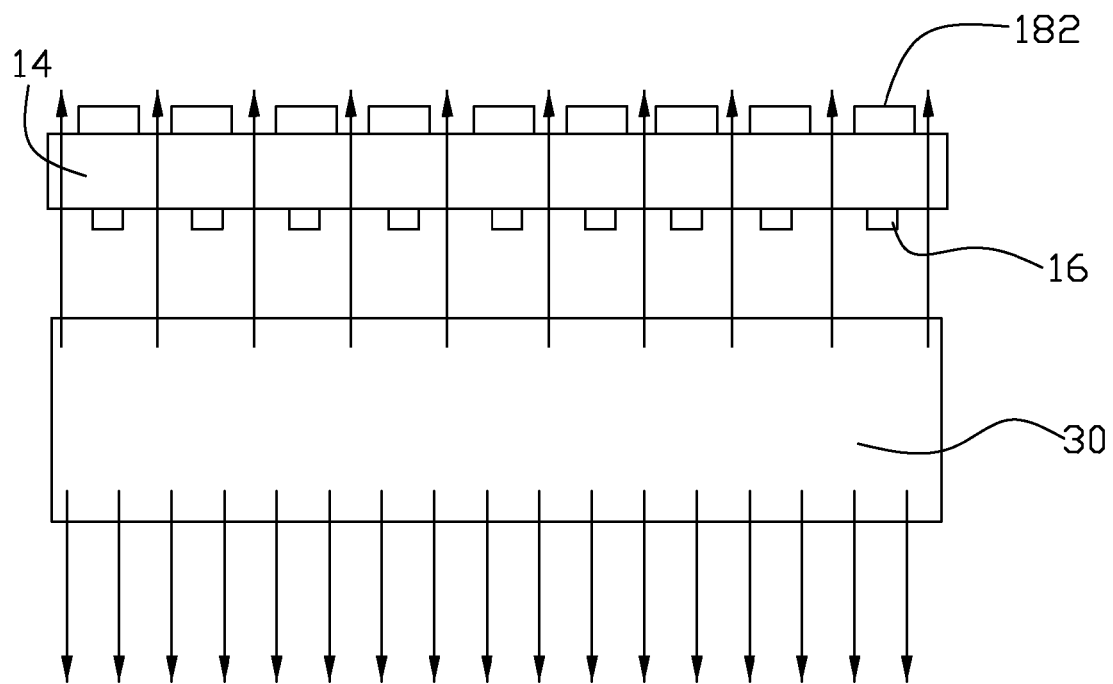
FIG. 3 is an enlarged schematic view of a cross-sectional view taken along line III-III of FIG. 1.

Referring to FIG. 3, while the wireless communication device is in use, the antenna 30 may transmit and receive signals. The signals can penetrate through the antenna clearance portion 14 between two adjacent second key contacts 182. It may be understood that the second key contacts 182 generate noise, which can interfere with the signals from the antenna 30. The plurality of ground contacts 16 can transmit the noise to the ground layer 121 of the ground portion 12. Therefore, the second portion 14 of the PCB 10 cannot greatly disturb signal transceiving capabilities of the antenna 30, and the antenna 30 has good signal transceiving capabilities.

Figure 4:
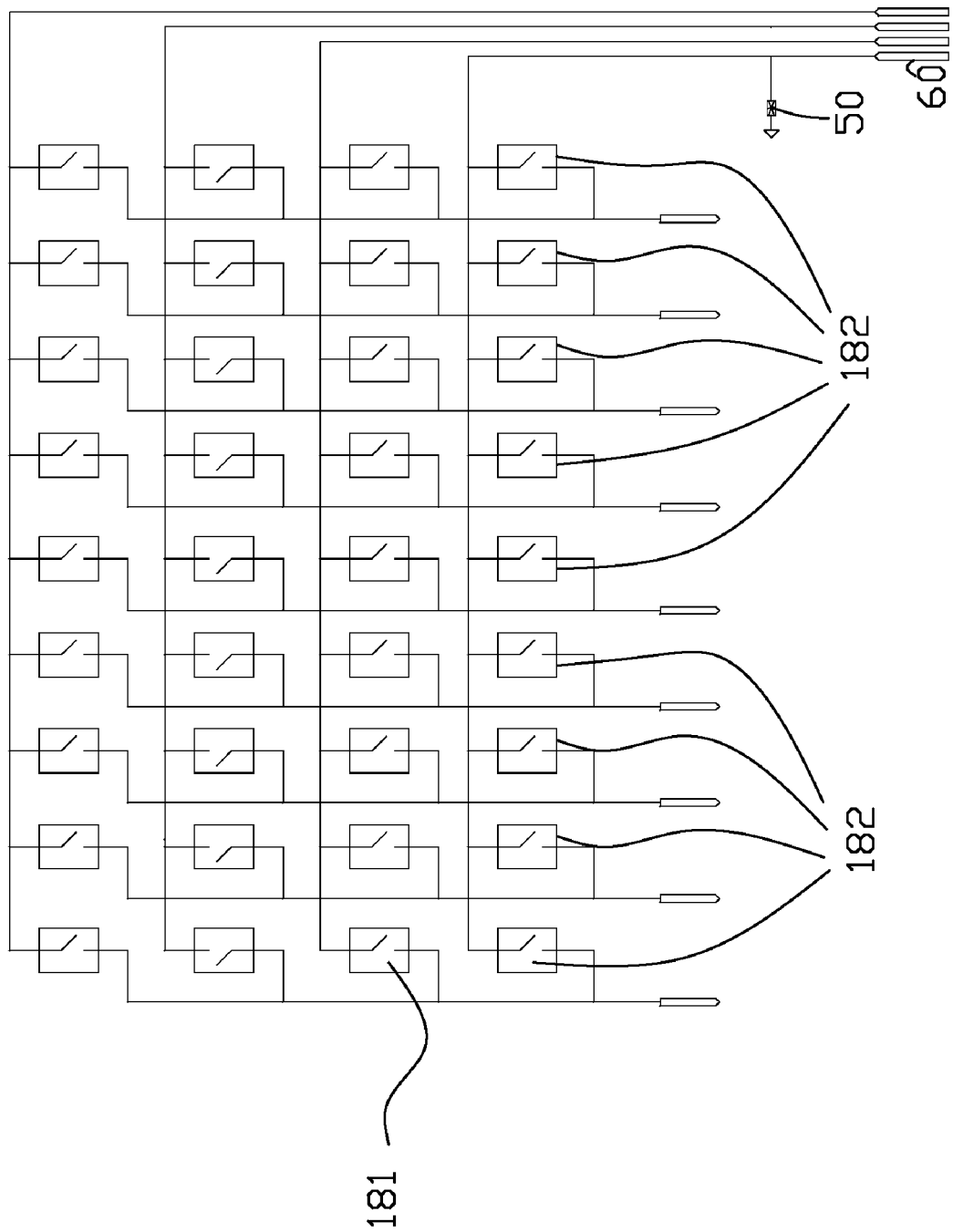
FIG. 4 is a circuit schematic view of a layout of a plurality of key contacts of FIG. 1.
Figure 5:
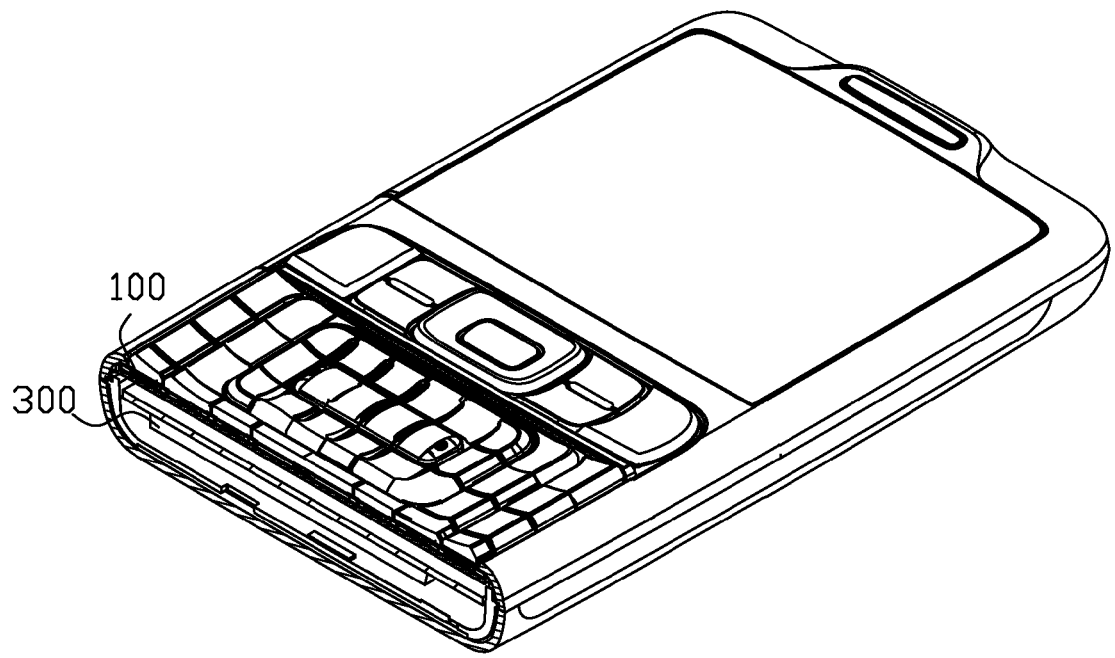
FIG. 5 is a perspective view of a commonly used mobile phone, with a cut away view of the bottom of the mobile phone.
Figure 6:
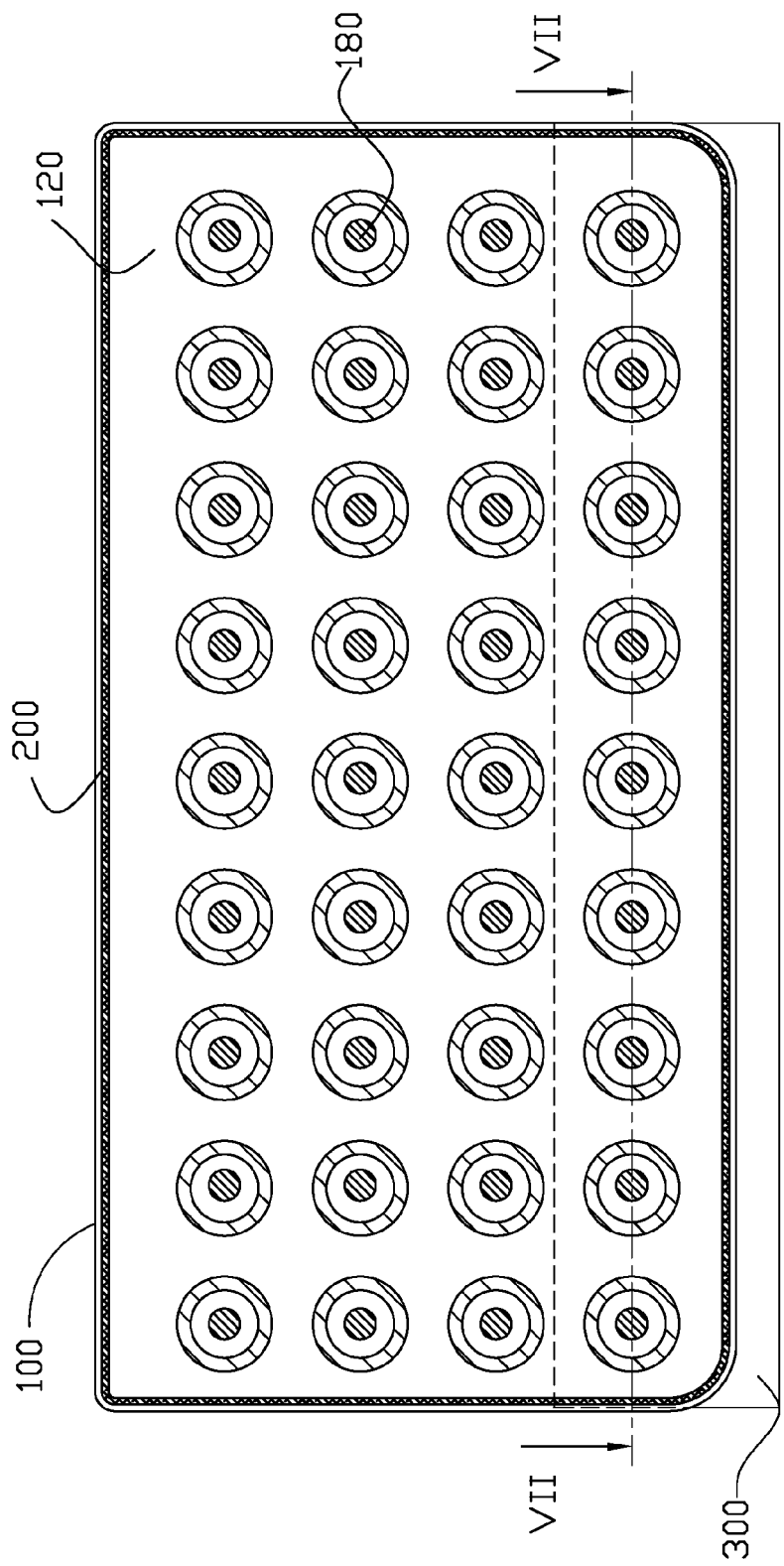
FIG. 6 is a schematic view of a key PCB layout of the mobile phone of FIG. 5.
Figure 7:
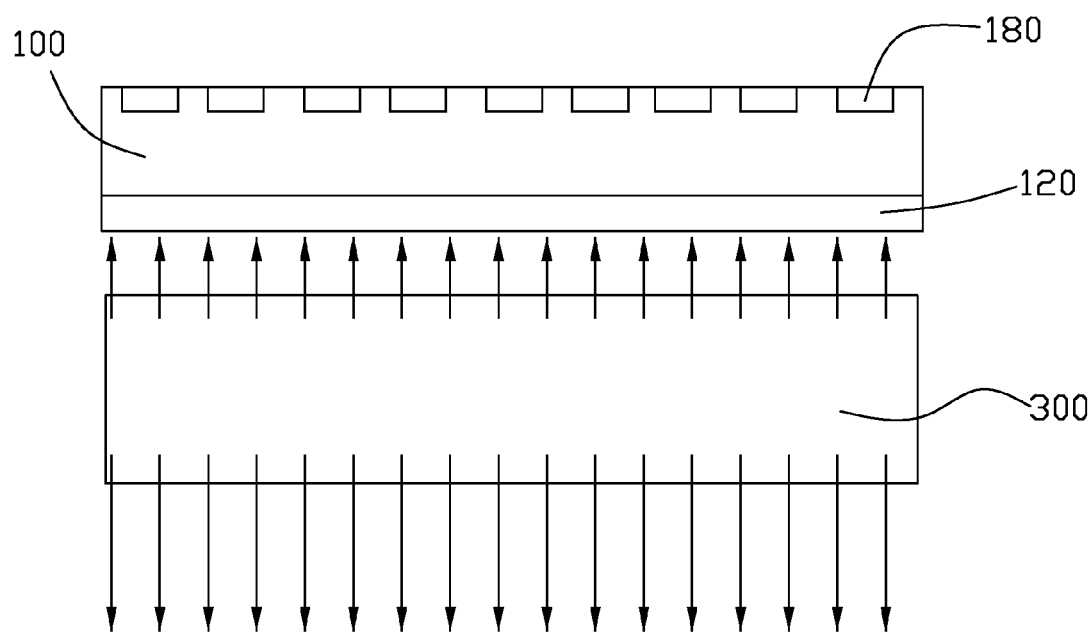
FIG. 7 is an enlarged schematic view of a cross-sectional view taken along VII-VII of FIG. 6.

Referring to FIG. 4, an electrical schematic view of a layout of the keys of the wireless communication device. The rows of second key contacts 182 are connected to a common pin 60 of a controller (not shown) of the wireless communication device electrically connecting to one electrostatic protection element 50, so the second key contacts 182 share a common scan code.

While exemplary embodiments have been described, it should be understood that they have been presented by way of example only and not by way of limitation. The breadth and scope of the disclosure should not be limited by the described exemplary embodiments, but only in accordance with the following claims and their equivalents.

What is claimed is:

1. A wireless communication device, comprising:
   a printed circuit board (PCB) comprising a ground portion and an antenna clearance portion, wherein:
      the ground portion is configured with a plurality of first key contacts surrounded by an electrostatic ring on a portion of a top surface of the PCB, and a ground layer disposed on a portion of a bottom surface corresponding to the portion of the top surface; and
      the antenna clearance portion is configured with a plurality of second key contacts on another portion of the top surface of the PCB, a plurality of ground contacts and a plurality of microstrips on another portion of the bottom surface of the PCB corresponding to the another portion of the top surface, wherein the plurality of ground contacts correspond to the plurality of second key contacts respectively, and the plurality of microstrips electrically connect the plurality of ground contacts to the ground layer of the ground portion;

at least one electrostatic protection element electrically connected to the plurality of second key contacts to protect the second key contacts from electrostatic interference; and an antenna disposed facing the another portion of the bottom surface.

2. The wireless communication device as claimed in claim 1, wherein each ground contact is disposed on a middle portion of a projection of each of the plurality of second key contacts.

3. The wireless communication device as claimed in claim 2, wherein the plurality of ground contacts are substantially circular shaped.

4. The wireless communication device as claimed in claim 1, wherein the second key contacts are connected to a common pin of a controller of the wireless communication device.

* * * * *